United States Patent
Yazaki et al.

(10) Patent No.: US 7,188,412 B2
(45) Date of Patent: Mar. 13, 2007

(54) METHOD FOR MANUFACTURING PRINTED WIRING BOARD

(75) Inventors: Yoshitarou Yazaki, Anjo (JP); Tomohiro Yokochi, Kariya (JP); Koji Kondo, Toyohashi (JP); Toshikazu Harada, Kariya (JP); Yoshihiko Shiraishi, Nagoya (JP)

(73) Assignee: Denso Corporation, Kariya (JP)

( * ) Notice: Subject to any disclaimer, the term of this patent is extended or adjusted under 35 U.S.C. 154(b) by 1 day.

(21) Appl. No.: 10/662,368

(22) Filed: Sep. 16, 2003

(65) Prior Publication Data

US 2004/0066633 A1 Apr. 8, 2004

Related U.S. Application Data

(62) Division of application No. 10/022,222, filed on Dec. 20, 2001, now Pat. No. 6,713,687.

(30) Foreign Application Priority Data

| Dec. 26, 2000 | (JP) | 2000-395601 |
| Mar. 28, 2001 | (JP) | 2001-94176 |
| Jul. 4, 2001 | (JP) | 2001-204024 |

(51) Int. Cl.
*H01K 3/10* (2006.01)

(52) U.S. Cl. .............. 29/852; 29/830; 29/840; 428/209

(58) Field of Classification Search .......... 29/825, 29/830, 832, 840, 852; 428/209
See application file for complete search history.

(56) References Cited

U.S. PATENT DOCUMENTS

| 4,221,925 A | | 9/1980 | Finley et al. |
| 4,303,715 A | * | 12/1981 | Chang .................. 428/137 |
| 5,031,308 A | | 7/1991 | Yamashita et al. |
| 5,227,588 A | * | 7/1993 | Schreiber et al. ........ 174/262 |
| 5,314,788 A | | 5/1994 | Suzuki et al. |
| 5,346,750 A | | 9/1994 | Hatakeyama et al. |

(Continued)

FOREIGN PATENT DOCUMENTS

| EP | 0 530 840 | 3/1993 |
| EP | 0 793 405 | 9/1997 |
| FR | 2 722 639 | 1/1996 |
| JP | A-7-176846 | 7/1995 |
| JP | A-08-148828 | 6/1996 |
| JP | A-10-81857 | 3/1998 |
| JP | A-11-204943 | 7/1999 |
| JP | A-2000-49460 | 2/2000 |
| JP | A-2001-77533 | 3/2001 |

OTHER PUBLICATIONS

Examination Report issued from Japanese Patent Office issued on Nov. 15, 2005 for the corresponding Japanese patent application No. 2001-204024 (a copy and English translation thereof).

*Primary Examiner*—Carl J. Arbes
(74) *Attorney, Agent, or Firm*—Posz Law Group, PLC

(57) ABSTRACT

Conductive paste containing tin particles and silver particles is packed in a substantially cylindrical via hole formed in a thermoplastic resin film that interposes between conductor patterns and is hot-pressed from both sides. When the metal particles contained in the conductive paste are sintered to form a unified conductive compound, the volume of the conductive paste shrinks. Synchronously, the resin film around the via-hole protrudes into the via-hole. Therefore, the shape of the side wall on the cross-section of the conductive compound provides an arch shape, and a side wall adjacent to a junction part of the conductive compound, which contacts the conductor pattern, is formed with an inclination. Therefore, it is possible to prevent the stress concentration due to deformation of the board.

9 Claims, 6 Drawing Sheets

U.S. PATENT DOCUMENTS

| | | |
|---|---|---|
| 5,359,767 A | 11/1994 | Chen et al. |
| 5,439,164 A | 8/1995 | Hasegawa et al. |
| 5,473,120 A | 12/1995 | Ito et al. |
| 5,481,795 A | 1/1996 | Hatakeyama et al. |
| 5,549,778 A | 8/1996 | Yokoyama et al. |
| 5,551,626 A | 9/1996 | Hasegawa et al. |
| 5,744,758 A | 4/1998 | Takenouchi et al. |
| 5,939,789 A * | 8/1999 | Kawai et al. ............... 257/758 |
| 5,977,490 A | 11/1999 | Kawakita et al. |
| 5,997,490 A * | 12/1999 | McLeod et al. ............... 601/97 |
| 6,010,769 A | 1/2000 | Sasaoka et al. |
| 6,087,597 A | 7/2000 | Shimada et al. |
| 6,207,259 B1 | 3/2001 | Iino et al. |
| 6,329,610 B1 * | 12/2001 | Takubo et al. ............... 174/264 |
| 6,713,687 B2 * | 3/2004 | Yazaki et al. ............... 174/263 |

\* cited by examiner

METHOD FOR MANUFACTURING PRINTED WIRING BOARD

CROSS REFERENCE TO RELATED APPLICATIONS

This application is a divisional application of U.S. patent application Ser. No. 10/022,222, now U.S. Pat. No. 6,713,687 filed Dec. 20, 2001 which is based on and incorporates herein by reference Japanese Patent Applications NO. 2000-395601 filed Dec. 26, 2000, No. 2001-94176 filed Mar. 28, 2001, and No. 2001-204024 filed Jul. 4, 2001.

FIELD OF THE INVENTION

The present invention relates to a printed wiring board and a manufacturing method thereof, specifically relates to a double-sided printed wiring board and a multilayer printed wiring board with a plurality of electrically-interconnected conductor pattern layers formed thereon and to a manufacturing method thereof.

BACKGROUND OF THE INVENTION

It is proposed that, in a printed wiring board, an insulator board includes a plurality of conductor patterns and the conductor patterns are interconnected by a conductive compound in a via-hole formed in the insulator board. As a manufacturing method for such a printed wiring board, a method shown in FIG. 12A is proposed. In this method, a substantially cylindrical via-hole 124 is formed in an insulator board 123, which is made of prepreg in B stage status prepared by impregnating a core material such as glass cloth with unset thermosetting resin. A conductive paste 150, which is an interlayer connecting material consisting of metal particles and binder resin made of unset thermosetting resin, is packed in the via-hole 124. Subsequently, the board and conductive foils 122 forming a conductor pattern are laminated.

By hot-pressing this piled body, as shown in FIG. 12B, the conductive paste 150 becomes a unified conductive compound 151 with the setting of the binder resin, and conductive foils 122 forming conductor patterns are interconnected by the substantially cylindrical conductive compound 151 formed in the substantially cylindrical via-hole 124.

In this proposed art, interconnection between the conductive foils 122 forming conductor patterns is achieved with the substantially cylindrical conductive compound 151. Therefore, in a case that the printed wiring board incurs a stress due to deformation such as bending, the conductive compound 151 is likely to incur stress concentration in the vicinity of a junction part 151b that is a junction part with the conductor pattern (the conductive foil 122). If repeated or large stress concentration is generated in the vicinity of the junction part 151b, reliability of the interconnection is lowered.

SUMMARY OF THE INVENTION

The present invention has been made in view of the above-mentioned aspects with an object to provide a printed wiring board having reliable interlayer connection and a fabrication method thereof.

To achieve the above object, a printed wiring board has a unified conductive compound in a via-hole. The compound has a side wall adjacent to an area contacting the conductor pattern. The wall has an inclination against the conductor pattern in such a manner that the farther from the conductor patterns on the side wall, the closer to the center axis of the via-hole.

Preferably, the conductive compound is formed such that the cross section thereof on the cross-sectional plane that passes the center axis of the via-hole provides an arch shape.

According to the invention, even in the case that a stress due to deformation such as bending is applied to the printed wiring board, it is possible to prevent the stress from concentrating in the vicinity of a junction part of the conductive compound. Therefore, the reliability of the interconnection avoids becoming worse. The film is made of thermoplastic resin. Therefore, when the conductive compound with the inclination of the side wall is formed, the insulator film is readily deformed plastically and the via-hole is readily formed in a shape conforming to the shape of the conductive compound.

Moreover, when the compound is formed by sintering metal particles, apparent volume is reduced. Therefore, the conductive compound is readily formed with the inclination of the side wall.

The conductor pattern is made of metal. The interlayer connecting material includes first and second metal particles. The first metal particles can form first alloy with the metal making up the conductor pattern. The second metal particles have higher melting point than the heating temperature for interconnecting layers and can form second alloy with the metal making up the first metal particle. The unified conductive compound is formed by hot-pressing the interlayer connecting material in the via-hole between a plurality of conductor patterns. Therefore, the conductor patterns are electrically interconnected with the conductive compound and the interposing solid phase diffusion layer that is formed by the mutual solid phase diffusion between the metal making up the conductor pattern and the first metal in the conductive compound.

Namely, the electrical interconnection between the conductor patterns is not made by mechanical contact so that the interlayer contact resistance hardly changes. Thus, the reliability of the interconnection is certainly enabled to avoid becoming worse.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Hereinafter, embodiments of the present invention are explained with reference to the drawings.

(First Embodiment)

Figure 1A:
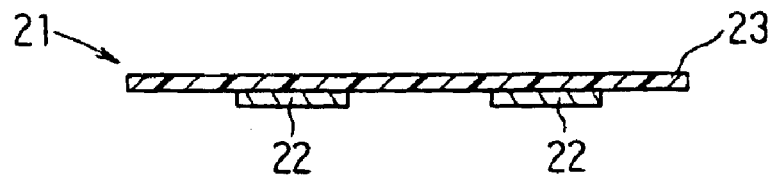
FIGS. 1A to 1E are process-by-process cross-sectional views showing production processes of a printed wiring board in the first embodiment of the present invention.

In FIG. 1A, a single-sided conductor pattern film 21 is shown as having a plurality of conductor patterns 22 that are defined by means of etching a conductive foil (a copper foil with 18 μm thickness in this embodiment) adhered onto one side of a resin film 23. In this embodiment, a thermoplastic film with 25–75 μm thickness, which is made of a mixture of 65–35% polyetheretherketone resin and 35–65% polyetherimide resin, is used as the resin film 23.

Figure 1B:
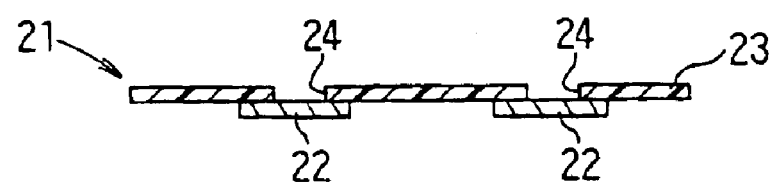

After the conductor pattern 22 is formed, a substantially cylindrical via-hole 24 bottomed with the conductor pattern 22 is formed by exposing the resin film 23 to carbon dioxide laser, as shown in FIG. 1B. During the formation of the via-hole 24, the conductor pattern 22 escapes being dug by the laser by adjusting the power and the exposure period of the carbon dioxide laser and such.

Other than the carbon dioxide laser, excimer laser or the like may be utilized for formation of the via-hole 24. In place of laser, other via-hole formation means such as drilling is applicable. However, hole machining by laser beam is preferable because of capability thereof in fine hole machining with the least damage to the conductor pattern 22.

Figure 1C:
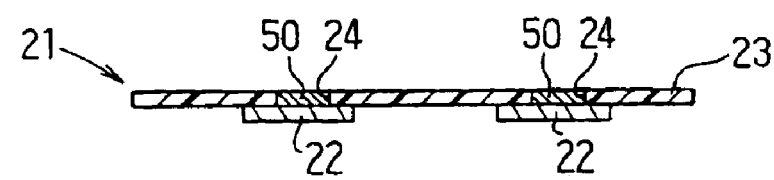

After the via-hole 24 is formed as shown in FIG. 1B, conductive paste 50 that is a material for interlayer connection is packed in the via-hole 24 as shown in FIG. 1C. The paste is prepared by the steps mentioned below. 60 g of terpineol, which is organic solvent, is added to 300 g of tin particles 61 (first metal particles and shown in FIG. 2A) with 5 μm mean particle size and 0.5 m²/g specific surface and 300 g of silver particles 62 (second metal particles and shown in FIG. 2A) with 1 μm mean particle size and 1.2 m²/g specific surface. The mixture is compounded by a mixer to make it pasty.

After the conductive paste 50 is printed and packed in the via-hole 24 of the single-sided conductor pattern film 21 by a screen printing machine with a metal mask, the terpineol is evaporated at 140–160° C. for 30 minutes. In this embodiment, the screen printing machine is used for packing the conductive paste 50 into the via-hole 24. However, other methods using a dispenser or the like are usable as long as the methods enable reliable packing.

Organic solvents other than terpineol are applicable as a solvent to make a paste. However, organic solvents with 150–300° C. boiling point are preferably used. Organic solvents having the boiling point of 150° C. or lower is likely to increase time-dependent variation of the viscosity of the conductive paste 50. On the other hand, organic solvent having boiling point higher than 300° C. is unfavorable because evaporation time thereof becomes longer.

In this embodiment, the tin particles with 5 μm mean particle size and 0.5 m²/g specific surface and the silver particles with 1 μm mean particle size and 1.2 m²/g specific surface are used for the conductive paste 50. The metal particles preferably have 0.5–20 μm mean particle size and 0.1–1.5 m²/g specific surface.

In the case that the metal particles have mean particle size smaller than 0.5 μm or specific surface larger than 1.5 m²/g, a lot of organic solvent is required for adjusting the paste to suitable viscosity for via-hole packing. Conductive paste containing a lot of organic solvent requires long time for evaporation, and a lot of gas is generated by the heating during interconnecting time period if the evaporation is insufficient. Therefore, voids are likely to be generated in the via-hole 24, and reliability of the interconnection is lowered.

On the other hand, in the case that the metal particles have mean particle size larger than 20 μm or specific surface smaller than 0.1 m²/g, it becomes difficult to pack the paste into the via-hole 24. In addition, the metal particles are likely to be unevenly distributed so that it also becomes difficult to provide the conductive compound 51 made of homogeneous alloy after heating.

Before the conductive paste 50 is packed into the via-hole 24, the surface of the conductor pattern 22 facing the via-hole 24 may be slightly etched or reduced. Thereby, solid phase diffusion described later is preferably done.

Figure 1D:
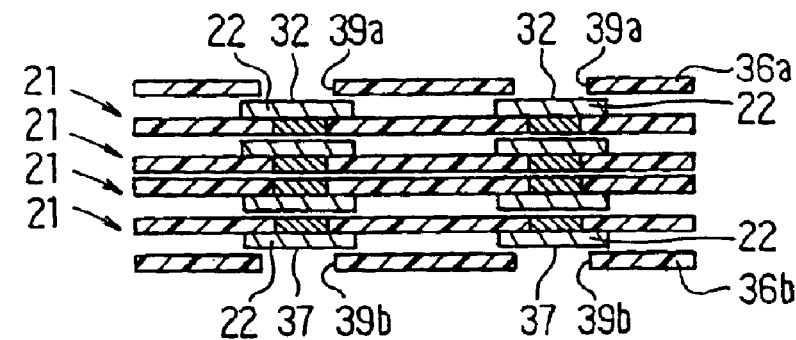

On the completion of the packing of the conductive paste 50 into the via-hole 24 and the evaporation thereof, a plurality of single-sided conductor pattern films 21 (four films, for instance) are piled, as shown in FIG. 1D. One pair of single-sided conductor pattern films 21 of the lower side are piled such that the side including the conductor pattern 22 faces downward. The other pair of single-sided conductor pattern films 21 of the upper side are piled such that the side including the conductor pattern 22 faces upward.

Namely, one pair of single-sided conductor pattern films 21 placed inside are piled together such that the side including no conductor pattern 22 faces each other. The other pair of single-sided conductor pattern films 21 are piled such that the side including conductor pattern 22 of one film faces the side including no conductor pattern 22 of the other film.

A cover layer 36a that is a resist film covering the conductor pattern 22 on the top layer is piled on the piled single-sided conductor pattern films 21 having a plurality of layers, and so is a cover layer 36b that is another resist film covering the conductor pattern 22 on the bottom layer.

The cover layer 36a is machined to provide a hole through which an electrode 32 is exposed in a predetermined position of the conductor pattern 22 on the top layer, and so is the cover layer 36b to provide another hole through which an electrode 37 is exposed in a predetermined position of the conductor pattern 22 on the bottom layer. In this embodiment, the same resin film as for the resin film 23, which is a thermoplastic film with 25–75 μm thickness, made of a mixture of 65–35% polyetheretherketone resin and 35–65% polyetherimide resin, is used for the cover layers 36a and 36b.

After piling the single-sided conductor pattern films 21 and the cover layer 36a, 36b as shown in FIG. 1D, the piled unit is hot-pressed from the top and bottom surfaces thereof by a vacuum hot-press machine. In this embodiment, the piled unit is pressed for 10–20 minutes under 2–10 MP pressure with heating temperature of 240–350° C.

Figure 1E:
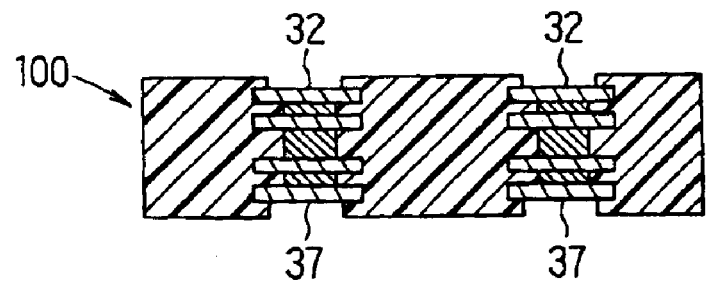

Thereby, as shown in FIG. 1E, each single-sided conductor pattern film 21 and the cover layer 36a, 36b are bonded together. While the resin films 23 and the cover layer 36a, 36b thermally fuse together to be unified, the conductor patterns 22 adjacent to the conductive paste 50 in the via-hole 24 are interconnected and a multilayer printed wiring board 100 with the electrode 32 on one side and the electrode 37 on the other side is provided. The resin film 23 and the cover layer 36a, 36b are made of the same thermoplastic resin so that both are firmly unified by being thermally softened and pressed.

Hereinafter, the mechanism of the interconnection is explained with reference to FIGS. 2A and 2B. When the paste 50 is heated at 240–350° C., the tin particles 61 melt and stick to the surface of the silver particles 62 because the melting point of the tin particles 61 and that of the silver particles 62 are 232° C. and 961° C., respectively. As the heating is continued in this condition, fused tin begins defusing from the surface of the silver particles and an alloy (melting point 480° C.) is made between tin and silver. In this case, the conductive paste is under 2–10 MP pressure. Therefore, as shown in FIG. 2B, the conductive compound 51 is formed in the via-hole 24 with the tin-silver alloy formation.

In addition, while the conductive compound 51 is formed in the via-hole 24, this pressurized conductive compound 51 is pressed toward the bottom of the via-hole 24. Thereby, tin contained in the conductive compound 51 and copper contained in the copper foil forming the conductor pattern 22 diffuse mutually, and a solid phase diffusion layer 52 is formed at the interface between the conductive compound 51 and the conductor pattern 22.

Figure 2A:
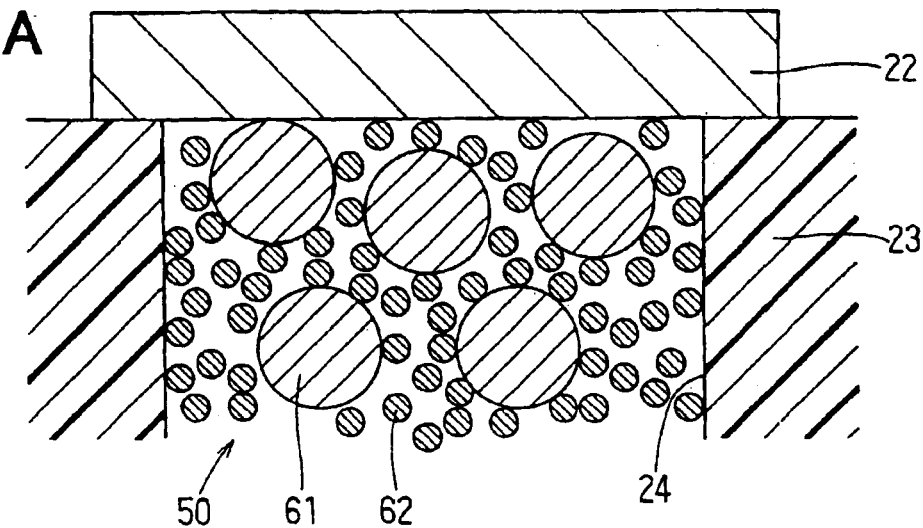
FIGS. 2A and 2B are partially-enlarged schematic views of printed wiring boards respectively after packing a conductive paste in a via-hole and after interconnecting layers in the first embodiment of the present invention.
Figure 2B:
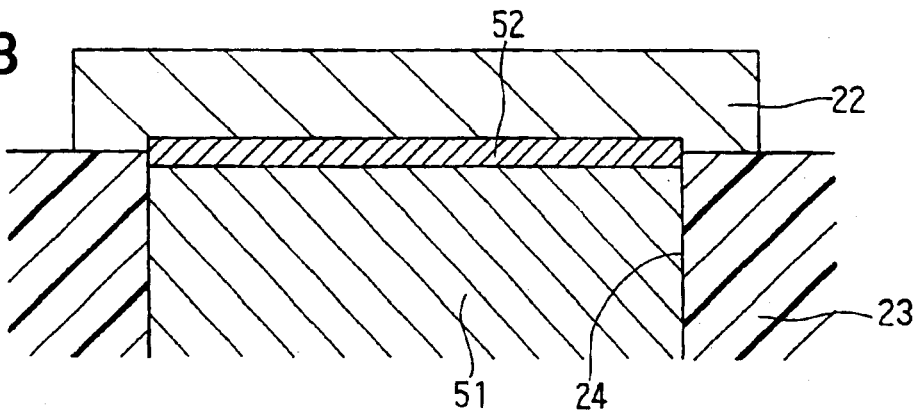

Although not shown in FIGS. 2A and 2B, the solid phase diffusion layer is formed similarly at the interface between the conductor pattern 22 at the lower side of the via-hole 24 and the conductive compound 51. Therefore, both conductor patterns 22 at the top and bottom of the via-hole 24 are electrically interconnected by the unified conductive compound 51 and the solid phase diffusion layer 52. In this way, while the conductor patterns 22 are interconnected by the hot-press with the vacuum hot-press machine, the conductive compound 51 continues to be sintered even after the solid phase diffusion layer 52 is formed, and the conductive compound 51 shrinks. In this embodiment, the conductive compound 51 is smaller in volume by 10–20% than the conductive paste 50.

Because the insulator resin film 23 is hot-pressed by the vacuum hot-press machine, the resin film 23 is deformed in an extendable direction and the resin film 23 adjacent to the via-hole 24 is deformed to protrude out into the via-hole 24. The modulus of elasticity of the resin film 23 is reduced to about 5–40 MPa while being hot-pressed by the vacuum hot-press machine. If the resin film 23 with reduced modulus of elasticity is pressed in this way, substantially homogeneous pressure (hydrostatic pressure) is generated in the insulator resin film 23.

The pressing is continued with substantially homogeneous pressure provided in the resin film 23, and the resin film 23 adjacent to the via-hole 24 is deformed plastically to protrude out into the via-hole 24. The protrusion amount of the resin film 23 into the via-hole becomes larger at the central part (the central part of the via-hole 24 in the direction of the center) of the via-hole 24 than at the end part (the end part of the via-hole 24 in the direction of the center axis) connected to the conductor pattern 22.

Figure 3:
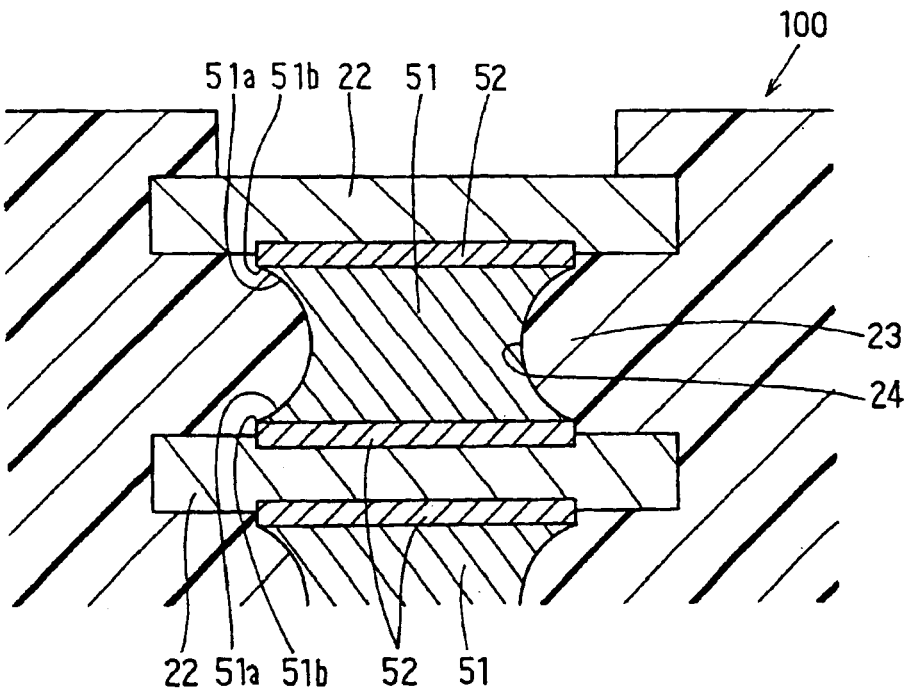
FIG. 3 is a partially-enlarged view showing schematically the shape of a conductive compound in the first embodiment of the present invention.

Namely, as shown in FIG. 3, the side wall of the via-hole 24, which is substantially cylindrical before hot-pressing, is deformed such that the shape of the side wall on the cross-section that passes the center axis of the via-hole 24 provides an arch shape by letting the resin film 23 protrude into the via-hole 24 as described above.

At that time, the apparent volume of the compound 51 decreases as the sintering proceeds. While shrinking, the compound 51 is pushed by the resin film 23 that protrudes such that the cross-section shape thereof provides an arch shape. Therefore, the deformation of the resin film 23 in the direction of the protrusion into the via-hole 24 proceeds synchronously with the shrinkage of the conductive compound 51 such that the side wall of the via-hole 24 is always in contact with the conductive compound 51. As a result, as shown in FIG. 3, the side wall of the conductive compound 51 is formed to provide an arch shape on the cross-section that passes the center axis of the via-hole 24.

Namely, a side wall 51a of the conductive compound 51 is formed with the inclination against the conductor pattern 22 in such a manner that the farther from the conductor patterns 22, the closer to the center axis of the via-hole 24.

The modulus of elasticity of the resin film 23 during the hot-pressing process is preferably 1–1000 MPa. If the modulus of elasticity is larger than 1000 MPa, it is difficult to provide homogeneous internal pressure in the resin film 23 and difficult to bond the resin films 23 together by fusing thermally. On the other hand, if the modulus of elasticity is smaller than 1 MPa, the resin film flows thermally too readily to hold a shape of the printed board 100.

The volume reduction ratio of the conductive compound 51 to the conductor paste 50 is preferably 5% or more. If the reduction ratio is smaller than 5%, it is difficult to form the side wall 51a of the conductive compound 51 with an inclination large enough against the conductor pattern 22.

According to the configuration and fabrication method in the first embodiment, even in the case that a stress due to a deformation such as bending is applied to the printed wiring board 100, it is possible to prevent the stress concentration in the junction part 51b shown in FIG. 3, because the side wall 51a of the conductive compound 51 is formed with an inclination. Moreover, any other part of the conductive compound 51 is likely to incur less stress concentration because the side wall of the conductive compound 51 is formed to provide an arch shape on the cross-section that passes the center axis of the via-hole 24. Therefore, the reliability of the interconnection is enabled to avoid becoming worse.

A plurality of conductor patterns 22 of the printed wiring board 100 are electrically interconnected with both conductive compound 51 including the tin-silver alloy formed by sintering and the solid phase diffusion layer 52 made between tin in the conductive compound 51 and copper making up the conductor pattern 22. Therefore, the electrical connection of the conductor patterns 22 is not achieved by mechanical contact so that the interlayer contact resistance hardly changes. Thus, the reliability of the interconnection is further prevented from becoming worse.

In addition, piled unification of the single-sided conductor pattern films 21 and the cover layer 36a, 36b and interconnection of the conductor patterns 22 are conducted simultaneously by the hot-press. Therefore, the number of fabrication processes for the printed wiring board 100 can be reduced and so can the fabrication costs of the board.

In this embodiment, the metal components of the conductive paste 50 are 50 weight % tin and 50 weight % silver. Tin content in the metal components is preferably 20–80%.

Figure 4:
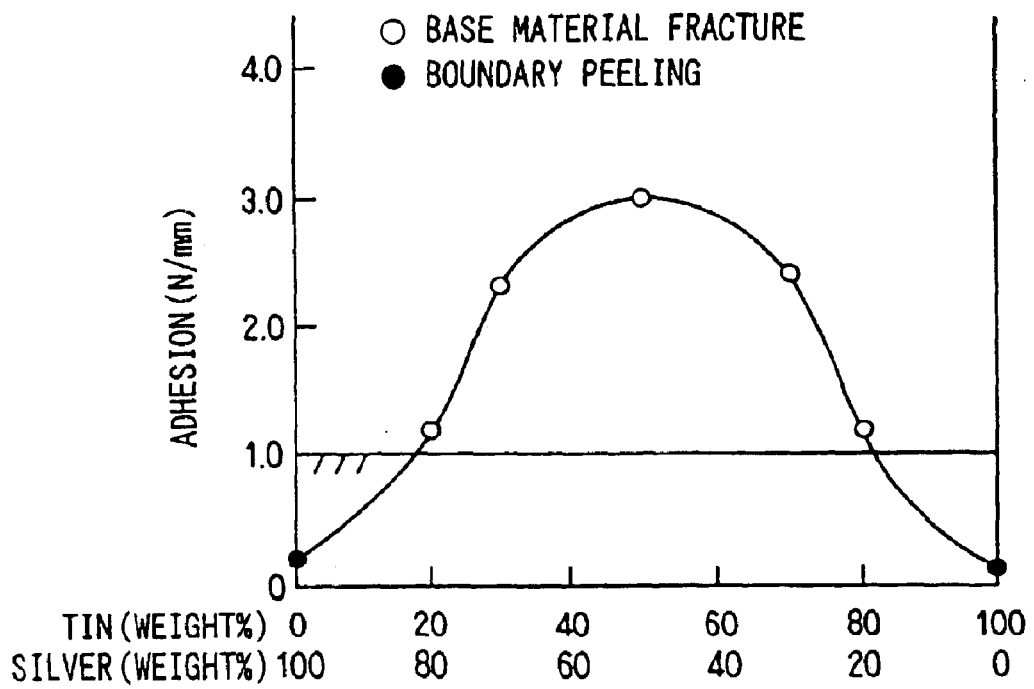
FIG. 4 is a graph showing the evaluation result on the adhesion between a copper foil forming the conductor pattern and the conductive compound.

FIG. 4 shows variation of the adhesion between the copper foil forming the conductor pattern 22 and the conductive compound when the ratio of tin to silver in the conductive paste 50 is varied. The adhesion evaluation has been conducted as follows. The same tin particles and silver particles as used for the conductive paste 50 in this embodiment are used as metal components. Terpineol is added to the metal components by the amount equivalent to 10 weight % of the metal components and the mixture is treated to provide a paste. The paste is printed on the shiny side of a copper foil and evaporated on the conditions described above. Subsequently, another copper foil is piled on the evaporated paste such that the mat side thereof contacts the paste. The two copper foils interposed by a conductive compound therebetween are bonded by the hot-press on the conditions described above.

The shiny side of one copper foil and the mat side of the other copper foil are bonded, because a via packed with the conductive compound in the via-hole thereof is formed between those sides when the single-sided conductor pattern films are piled in the fabrication of the printed wiring board such that each film faces the same direction. The bonded two copper foils are peeled at the speed of 10 mm/min and the peeling strength is defined as the adhesion therebetween.

It turns out that tin content between 20–80% provides preferable adhesion more than 1.0 N/mm, which is an adhesion between the insulator and the copper foil. The fracture mode in the peeling in 20–80% tin content range is not the boundary peeling between the copper foil and the conductive compound, but the internal fracture of the conductive compound. This means that a solid phase diffusion layer more robust than the conductive compound is formed between the copper foil and the conductive compound.

Figure 5:
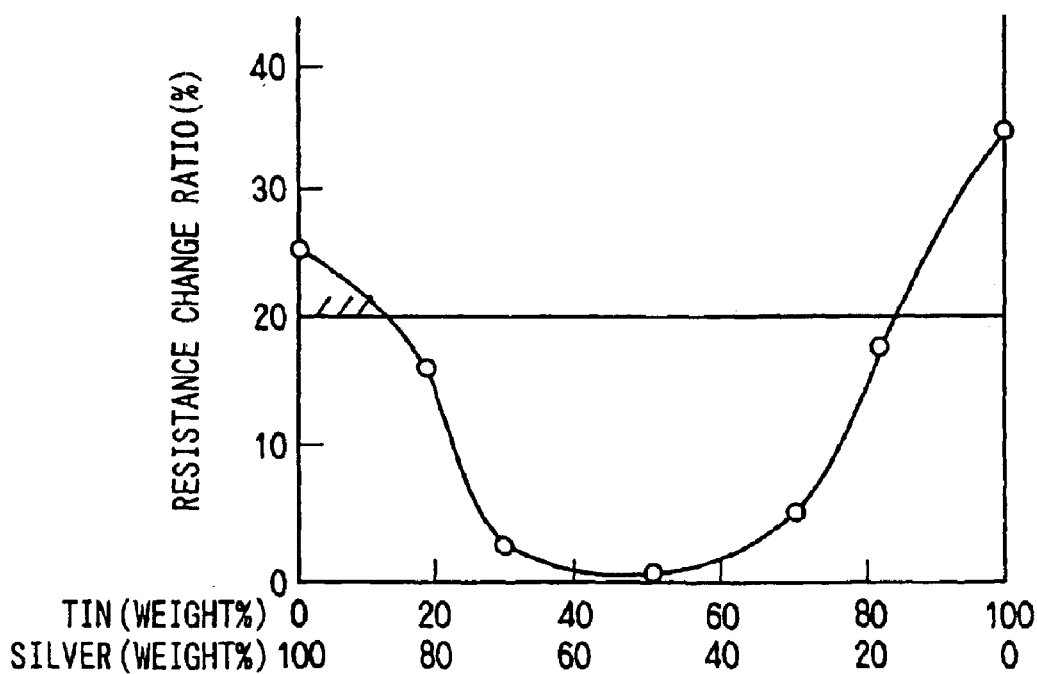
FIG. 5 is a graph showing the change ratio in the via serial resistance of the printed wiring board after reflow-soldering process of the printed wiring board.

FIG. 5 shows the change ratio of the serial via resistance to the via initial serial resistance after reflow-soldering process of the printed wiring board 100 when the ratio of tin to silver in the conductive paste 50 packed in the via-hole 24 are varied.

The evaluation has been conducted as follows. The same tin particles and silver particles as used for the conductive paste 50 described above in this embodiment are used as metal components. Terpineol is added to the metal components by the amount equivalent to 10 weight % of the metal components and the mixture is treated to provide a paste. The paste 50 is packed in the via-hole 24 of a single-sided conductor pattern film and evaporated on the conditions described above. A copper foil is piled on the insulator side of the single-sided conductor pattern film. The piled unit is hot-pressed on the conditions described above. A double-sided board having conductor patterns for measuring the serial resistance of the via is prepared in this way.

Afterward, the via serial resistances of the double-sided board are measured as prepared and after the board is passed through a reflowing process with the temperature of 250° C. and time period of 5 minutes. The resistance change ratio therebetween is calculated from the measured values.

It turns out that the tin content between 20–80% ensures that the resistance change ratio by the reflowing is 20% or smaller, which is generally the maximum value to provide preferable reliability. Therefore, it is possible to provide a printed wiring board with excellent connecting reliability if the printed wiring board is manufactured by using, as an interlayer connecting material, the conductive paste 50 with 20–80% tin content in the metal components, as described above.

In this embodiment, the conductive paste 50 contains the tin particles 61 and the silver particles 62, and the conductive compound 51 is formed by alloying and sintering both metals. However, the conductive paste 50 need not necessarily be a material whose metal particles are sintered. For example, the conductive paste 50 may be a material that contains metal particles and unset thermosetting resin as binder resin and becomes a conductive compound whose metal particles are supported by set thermosetting resin.

As long as the volume of a conductive compound is reduced (preferably reduced by more than 5%) due to the shrinkage of a thermosetting resin in comparison with that of a conductive paste, it is possible to form a side wall of the conductive compound with the inclination against the conductor pattern in such a manner that the farther from the conductor patterns, the closer to the center axis of the via-hole. In this case as well, it is possible to prevent a stress from concentrating in the vicinity of a junction part between the conductive compound and the conductor pattern. However, in this case, the interconnection is based on contact conduction so that the embodiment described above is more preferable from the standpoint of reliability.

In this embodiment, silver particles are used as the second metal particles. However, any other metal particles may be used as long as the particles do not fuse during the interconnecting period and form an alloy with tin that is the first metal particles. Applicable metals are copper (mp 1083° C.), gold (mp 1063° C.), platinum (mp 1769° C.), palladium (mp 1552° C.), nickel (mp 1453° C.), zinc (mp 419° C.) or the like. As the second metal particles, these may be used either separately or in combination on a case-by-case basis.

In this embodiment, metal particles contained in the conductive paste 50 are only the tin particles 61 and the silver particles 62. However, for the purpose of improving shape-holding capability of the conductive paste 50, metal particles with low melting point (e.g., iridium particles) or with about 1–100 nm particle particle size (e.g., silver) may be added to the paste 50. Thereby, it is possible to keep the shape-holding capability of the conductive paste 50 better until the interlayer connecting process.

Moreover, other metal particles that do not form an alloy with tin may be added for the sake of adjusting the thermal expansion coefficient of the conductive compound 51 close to that of the insulator resin film 23. Other than metal particles, nonconductive inorganic filler or the like may be added. However, it is unfavorable to add too much to unify the conductive compound 51.

In this embodiment, the conductive paste 50 consists of the metal particles 61 and 62 and organic solvent. A dispersing agent may be added to the conductive paste 50 by an amount equivalent to 0.01–1.5 weight % of the total solid components of the conductive paste 50. This makes it easier to disperse homogeneously the metal particles in the conductive paste 50. Dispersing agent content less than 0.01 weight % provides scarcely dispersion effect, and dispersing agent content more than 1.5 weight % hinders the unification of the conductive compound 51 by sintering. It is possible to use phosphoric ester and stearic ester or the like as the dispersing agent.

In this embodiment, instead of pasty material for the conductive paste 50, grainy material is applicable as long as it is possible to pack the material in the via-hole 24.

(Second Embodiment)

Figure 6A:
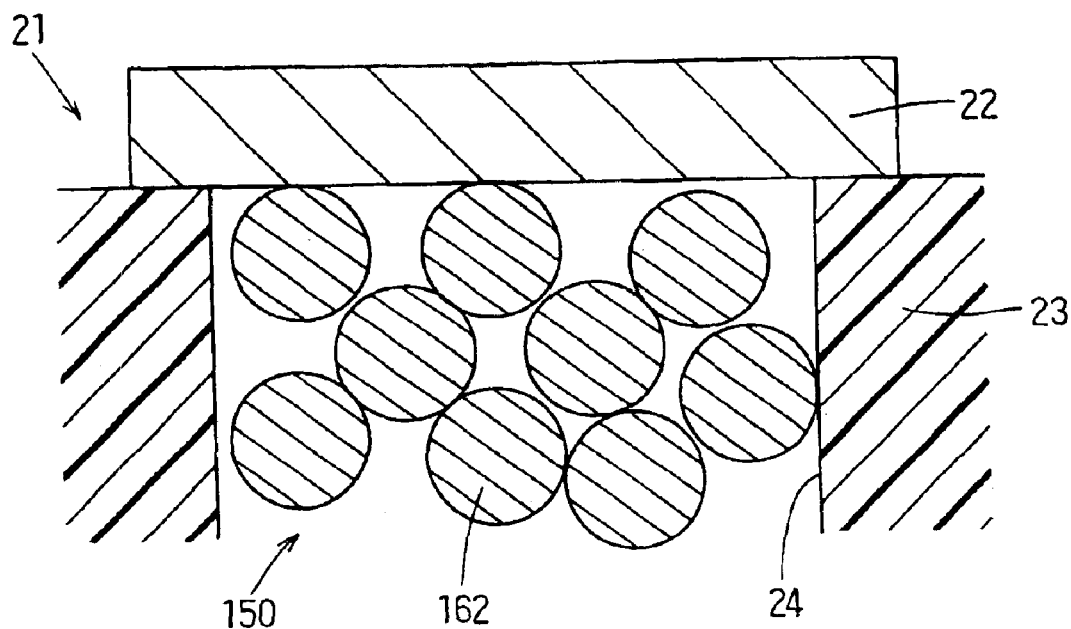
FIGS. 6A and 6B are partially-enlarged schematic views showing respectively the states after packing the conductive paste in the via-hole and after interconnecting layers in the second embodiment of the present invention.
Figure 6B:
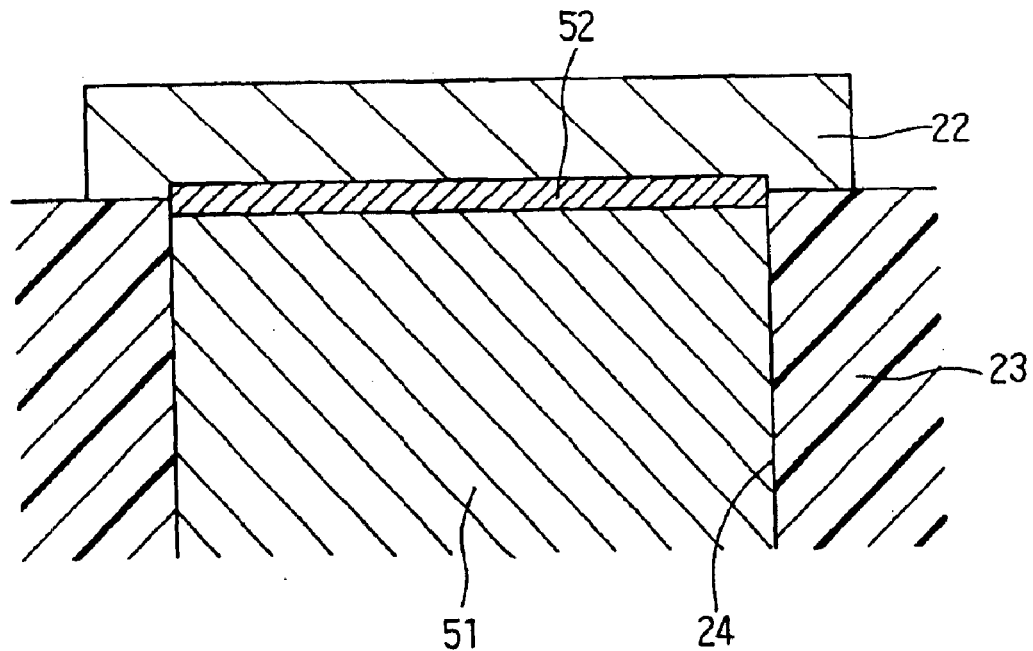

It is possible to use conductive paste including alloy particles that consist of first metal making up the first metal particles and second metal making up the second metal particles. For example, as shown in FIG. 6A, conductive paste 150, which consists of organic solvent and alloy particles 162 including 50 weight % tin and 50 weight % silver, is packed in the via-hole 24 of the single-sided conductor pattern film 21 and evaporated. Afterward, the single-sided conductor pattern films 21 are preferably piled and the piled unit is hot-pressed from both sides thereof for forming the unified conductive compound 51 by sintering the alloy particles in the via-hole 24.

The conductive compound 51 is pressurized while being pressed in the via-hole 24 so that the compound 51 is pressed toward the surface of the conductor pattern 22, which makes up the bottom of the via-hole 24. Thereby, tin contained in the conductive compound 51 and copper of the copper foil forming the conductor pattern 22 diffuse mutually in solid phase to form the solid phase diffusion layer 52 at the boundary between the conductive compound 51 and the conductor pattern 22.

When the sintering of the alloy 162 proceeds as described above, the resin film 23 is deformed such that the film 23 protrudes into the via-hole 24 as the volume of the conductive compound 51 decreases. Therefore, the same effect as in the first embodiment is provided.

At that time, as described above, the second metal is not limited to silver. Copper, gold, platinum, palladium, nickel, zinc or the like are applicable as the second metal particles either separately or in combination. In this embodiment, the metal components of the conductive paste 150 are 50 weight % tin and 50 weight % silver. As well as in the first embodiment, tin content of the metal components is preferably 20–80%.

Furthermore, in the embodiments described above, the single-sided conductor pattern films 21 are piled, as shown in FIG. 1D, in the fabrication processes of the printed wiring board 100. However, piling configuration is not limited to this one, but any other configurations may be used as long as the configurations are for providing multilayer or double-sided printed wiring board requiring interlayer connection.

Figure 7:
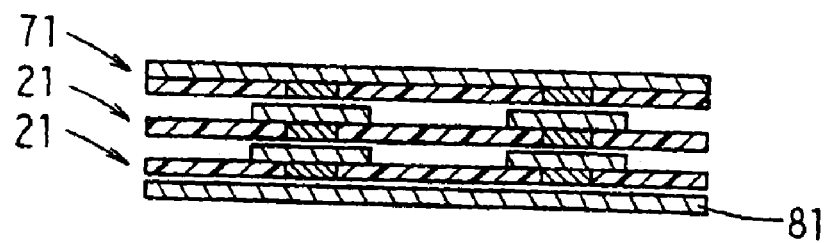
FIG. 7 is a cross-sectional view showing an element piling configuration for a multilayer printed wiring board.

For example, a configuration shown in FIG. 7 is possible. In this configuration, a multilayer printed wiring board is made with steps of piling together a single-sided conductor pattern film 71 having a copper foil conductor pattern covering a whole side thereof, single-sided conductor pattern films 21 and a copper foil 81, then hot-pressing the piled unit, and afterward defining the copper foils on both sides.

Figure 8:
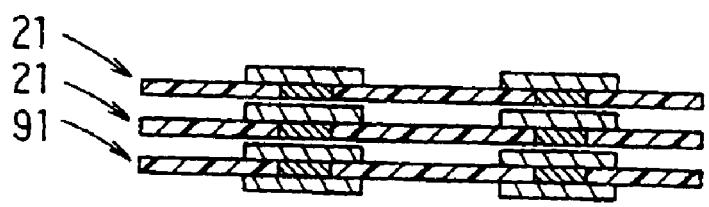
FIG. 8 is a cross-sectional view showing another element piling configuration for a multilayer printed wiring board.

Another configuration shown in FIG. 8 is possible as well. In this configuration, a multilayer printed wiring board is made with steps of piling together single-sided conductor pattern films 21 and a double-sided film 91, and afterward hot-pressing the piled unit.

Figure 9:
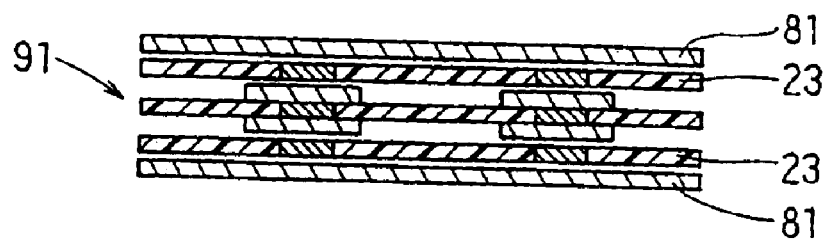
FIG. 9 is a cross-sectional view showing other element piling configuration for a multilayer printed wiring board.

Moreover, other configuration shown in FIG. 9 is possible as well. In this configuration, a multilayer printed wiring board is made with steps of piling the resin film 23 on both sides of the double-sided film 91, then piling the copper foils 81 to the piled unit, and afterward hot-pressing the finally piled body.

Figure 10:
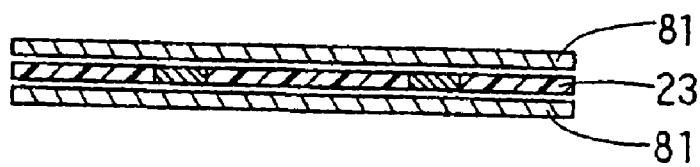
FIG. 10 is a cross-sectional view showing other element piling configuration for a multilayer printed wiring board.

Other configuration shown in FIG. 10 is possible as well. In this configuration, a multilayer printed wiring board is made with steps of piling the copper foils 81 on the resin film 23, then hot-pressing the piled unit, and afterward defining the copper foils on both sides.

Figure 11:
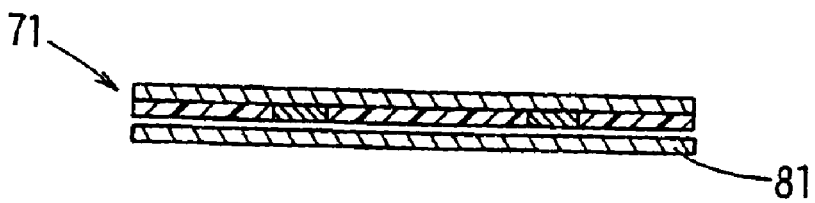
FIG. 11 is a cross-sectional view showing other element piling configuration for a multilayer printed wiring board.
Figure 12A:
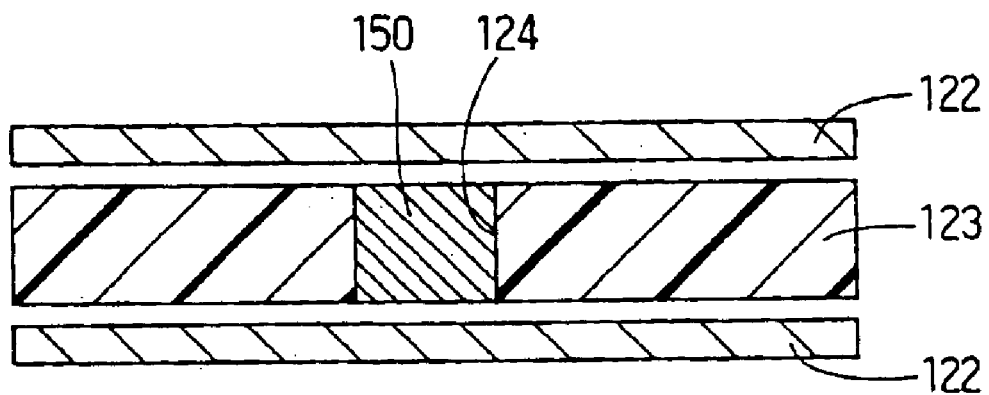
FIGS. 12A and 12B are partially-enlarged schematic views of printed wiring boards respectively after packing a conductive paste in a via-hole and after interconnecting layers in the related art.
Figure 12B:
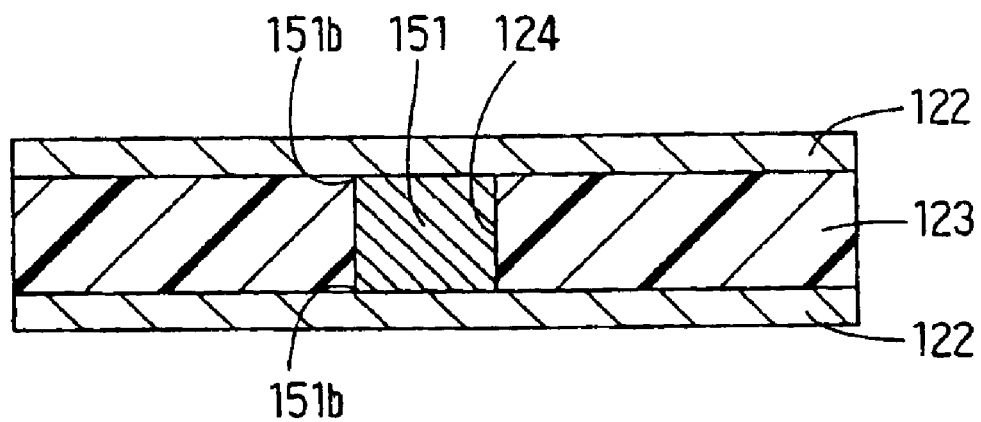

Other configuration shown in FIG. 11 is possible as well. In this configuration, a multilayer printed wiring board is made with steps of piling together the single-sided conductor pattern film 71 and the copper foil 81, then hot-pressing the piled unit, and afterward defining the copper foils on both sides.

In the embodiments described above, a resin film made of a mixture of 65–35% polyetheretherketone resin and 35–65% polyetherimide resin is used for the resin film 23 and the cover layer 36a, 36b. Instead of this film, it is possible to use a film made by adding nonconductive filler to polyetheretherketone resin and polyetherimide resin. It is also possible to use only one of polyetheretherke tone (PEEK) and polyetherimide(PEI).

In addition, thermoplastic polyimide or liquid crystal polymer is applicable as well. It is preferable to use a resin film having 1–1000 MPa modulus of elasticity at the heating temperature during the hot-pressing and having thermal resistance needed for soldering in later processes.

In the embodiments described above, copper is used as metal making up the conductor pattern 22. However, other than copper, it is possible to use other metals that diffuse mutually in the solid phase with tin contained in the conductive compound 51. In addition, the conductor pattern 22 does not have to be entirely made of the metal that diffuses mutually with tin (the first metal) contained in the conductive compound 51. It is possible to use a conductor pattern having a plated layer thereon, which is made of a metal such as silver and gold and diffuses mutually with tin (the first metal) contained in the conductive compound 51. Any conductor patterns are applicable as long as the patterns have metal that can diffuse mutually with tin (the first metal) contained in the conductive compound 51 at the position thereof correspondent to the via-hole 24.

In the embodiments described above, the printed wiring board 100 consists of four layers. However, as a matter of course, as long as the board 100 consists of a plurality of conductor pattern layers, the number thereof is not limited.

What is claimed is:

1. A fabrication method for a printed wiring board, the method comprising:

providing an insulator board made of thermoplastic resin and having a via-hole, a first surface and a second surface that is opposite the first surface;

providing first and second conductor patterns that are respectively located on the first surface and the second surface to cover the via-hole, and that include a metal;

packing an interlayer connecting material in the via-hole formed in the insulator board, the interlayer connecting material including a first metal and a second metal having a higher melting point than a healing temperature required for interconnecting the first and second conductor patterns; and interconnecting electrically the first and second conductor patterns with a unified conductive compound formed from the first and second metals sintered by hot-pressing the interlayer connecting material in the via-hole between the first and second conductor patterns, wherein, by the interconnecting, first and second solid phase diffusion layers are formed from the metal in the first and second conductive patterns and the first metal of the unified conductor compound diffused into the metal in the first and second conductor patterns and are located between the unified conductive compound and the first and second conductor pattern, and a volume of the unified conductive compound is reduced relative to a volume of the interlayer connecting material, a sidewall of the unified conductive compound in the via-hole becomes concave in shape and approaches a center axis of the via-hole approximatley halfway between the first surface and the second surface of the insulator board, and the first and second conductor patterns are electrically interconnected by the unified conductive compound and the first and second solid phase diffusion layers.

2. The fabrication method as in claim 1, wherein a cross section of unified conductive the compound is formed in an arch shape on a cross-sectional plane passing through the center axis of the via-hole in the interconnecting.

3. The fabrication method as in claim 1, wherein volume reduction ratio of the unified conductive compound to the interlayer connecting material is more than 5%.

4. The fabrication method as in claim 1, wherein:

the first metal and the second metal in the interlayer connecting material are in the form of metal particles; and the interconnecting includes sintering the metal particles to form the unified conductive compound when the interlayer connecting material is hot-pressed.

5. The fabrication method as in claim 4, wherein:

the metal particles of the first metal form a first alloy with the metal making up the conductor pattern, and the metal particles of the second metal have a higher melting point than a heating temperature at hot-pressing and form a second alloy with the metal particles of the first metal; and the first and second of conductor patterns are interconnected electrically by forming the sintered and unified conductive compound by making the second alloy and by promoting mutual solid phase diffusion between the metal particles of the first metal and the conductor pattern through the hot-pressing of the interlayer connecting material interposed between the first and second conductor patterns.

6. The fabrication method as in claim 1, wherein the interconnecting includes heating the insulator board at a temperature at which modulus of elasticity of the thermoplastic resin making up the insulator board is 1–1000 MPa.

7. The fabrication method as in claim 5, wherein the metal particles of the first metal are tin and are included in the interlayer connecting material by an amount between 20 weight % and 80 weight %.

8. The fabrication method as in claim 7, wherein the tin is included by an amount of 50 weight %.

9. The fabrication method as in claim 7, wherein the metal particles of the second metal are silver.

* * * * *